(12) United States Patent
Li et al.

(10) Patent No.: US 11,171,650 B2
(45) Date of Patent: Nov. 9, 2021

(54) REVERSIBLE LOGIC CIRCUIT AND OPERATION METHOD THEREOF

(71) Applicant: HUAZHONG UNIVERSITY OF SCIENCE AND TECHNOLOGY, Hubei (CN)

(72) Inventors: Yi Li, Hubei (CN); Long Cheng, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 16/965,602

(22) PCT Filed: Jul. 16, 2019

(86) PCT No.: PCT/CN2019/096068
§ 371 (c)(1),
(2) Date: Jul. 29, 2020

(87) PCT Pub. No.: WO2020/173040
PCT Pub. Date: Sep. 3, 2020

(65) Prior Publication Data
US 2021/0218402 A1    Jul. 15, 2021

(30) Foreign Application Priority Data

Feb. 27, 2019  (CN) .......................... 201910145406.1

(51) Int. Cl.
*H03K 19/177* (2020.01)
*H03K 19/173* (2006.01)

(52) U.S. Cl.
CPC ................ *H03K 19/1733* (2013.01)

(58) Field of Classification Search
CPC .................................................. H03K 19/1733
See application file for complete search history.

(56) References Cited

U.S. PATENT DOCUMENTS 9,601,692 B1 *  3/2017  Jo ...................... G11C 13/0097
9,871,077 B2 *  1/2018  Xia ..................... H01L 27/2463
(Continued)

FOREIGN PATENT DOCUMENTS

| CN | 104898990 | 9/2015 |
| CN | 106373611 | 2/2017 |
| CN | 109905115 | 6/2019 |

OTHER PUBLICATIONS

"International Search Report (Form PCT/ISA/210) of PCT/CN2019/096068," dated Nov. 27, 2019, pp. 1-4.

*Primary Examiner* — Kurtis R Bahr
(74) *Attorney, Agent, or Firm* — JCIP Global Inc.

(57) ABSTRACT

A reversible logic circuit and an operation method thereof are provided. The logic circuit includes resistive switching cells, word lines, and bit lines. The word lines and the bit lines are perpendicular to each other. The anode of a resistive switching cell is connected to the word line as a first input terminal to apply logic operating voltage or be grounded. The cathode of a resistive switching cell is connected to the bit line as a second input terminal to apply logic operating voltage or be grounded. When performing reversible logic operation, four levels of resistance states of the resistive switching cell are used as logic outputs to implement single-input NOT and dual-input C-NOT reversible logic functions.

9 Claims, 4 Drawing Sheets

(56) References Cited

U.S. PATENT DOCUMENTS

| | | | |
|---|---|---|---|
| 9,945,727 B2* | 4/2018 | Samarao | H01L 27/14669 |
| 2012/0281465 A1* | 11/2012 | Agan | G11C 11/1675 |
| | | | 365/158 |
| 2015/0249096 A1* | 9/2015 | Lupino | G11C 5/02 |
| | | | 257/203 |
| 2015/0256178 A1* | 9/2015 | Kvatinsky | H03K 19/177 |
| | | | 326/31 |
| 2016/0133836 A1* | 5/2016 | Lan | H01L 27/249 |
| | | | 365/51 |
| 2018/0122825 A1* | 5/2018 | Lupino | G11C 11/1675 |

* cited by examiner $V_2+V_3=V_4, V_1=V_4$ single-input NOT reversible logic

| input | output |
|---|---|
| 0 | 1 |
| 1 | 0 | dual-input C-NOT reversible logic

| input | | output | |
|---|---|---|---|
| 0 | 0 | 0 | 0 |
| 0 | 1 | 0 | 1 |
| 1 | 0 | 1 | 1 |
| 1 | 1 | 1 | 0 |

REVERSIBLE LOGIC CIRCUIT AND OPERATION METHOD THEREOF

CROSS-REFERENCE TO RELATED APPLICATION

This application is a 371 of international application of PCT application serial no. PCT/CN2019/096068, filed on Jul. 16, 2019, which claims the priority benefit of China application no. 201910145406.1, filed on Feb. 27, 2019. The entirety of each of the above mentioned patent applications is hereby incorporated by reference herein and made a part of this specification.

BACKGROUND

Technical Field

The disclosure relates to the field of digital circuits, and more specifically relates to a reversible logic circuit and an operation method thereof.

Description of Related Art

Reversible logic has a very important application prospect in the field of information processing technology. From the point of view of informatics, bit number of the output information are less than bit number of the input information in the traditional Boolean logic gate circuit, and the lost information bits will cause energy dissipation. On the other hand, bit number of the output information are equal to bit number of the input information in the reversible logic gate, so energy dissipation is greatly reduced, which helps to improve logic calculation performance. The structure of current reversible logic gate circuit based on a complementary metal oxide semiconductor (CMOS) device is very complicated, which is not conducive to large-scale integration. One is because of the structure complexity of the CMOS transistor device itself, and the other is because the reversible logic gate is constructed by the complex Boolean logic gate circuits. Therefore, a simple and efficient method for implementing the reversible logic function is required.

The non-volatile resistive device has a simpler structure than the CMOS transistor device, and the resistance value can be changed along with the changes of current flowing through it. For a two-level resistance state resistive device, the high resistance state and low resistance state thereof may be used to represent information "0" and "1" for information storage. In addition, the resistive device has also been proposed to implement logic operations. The logic operation based on the resistive device may use resistance as a logic signal, and the operation result is directly stored in the resistance state of the device. That is, the calculation and storage of data are completed in the same device or circuit to implement the fusion of information storage and calculation, so as to improve information processing efficiency. For a multi-level resistance state resistive device, more logic functions may be implemented, including multi-valued logic calculation, non-binary logic calculation, reversible logic, and other functions. The exploration of the reversible logic function based on the multi-level resistance state resistive device expands the application scope of the resistive device and improves capability of the information processing.

SUMMARY

In view of the defects of the prior art, the objective of the disclosure is to provide a reversible logic circuit based on a multi-level resistance state resistive device and an operation method thereof, which aim to solve the issues that a complementary metal oxide semiconductor (CMOS) reversible logic circuit has a complicated structure and is not easy to be integrated.

The disclosure provides a reversible logic circuit, including a resistive switching cells, word lines, and bit lines. The word lines and the bit lines are perpendicular to each other. Each word line and each bit line are connected by one resistive switching cell in between. The anode of a resistive switching cell is connected to the word line. The cathode of a resistive switching cell is connected to the bit line. The anode of the resistive switching cell may be used as a first input terminal to apply logic operating voltage or be grounded. The cathode of the resistive switching cell may be used as a second input terminal to apply the logic operating voltage or be grounded. When current flows from the bit line where the resistive switching cell is located to the word line, that is, from the cathode to the anode of the resistive switching cell, a resistance value of the resistive switching cell becomes greater. The resistive switching cell has a maximum resistance value. When the maximum resistance value is reached, even if current flows from the cathode to the anode of the cell, the resistance value of the cell cannot be further increased. The maximum resistance value is recorded as a first-level resistance state, which is recorded as logic 0 when applied to a single-input reversible logic; and is recorded as logic 00 when applied to a dual-input reversible logic. When current flows from the word line where the resistive switching cell is located to the bit line, that is, from the anode to the cathode of the resistive switching cell, the resistance value of the resistive switching cell will become less. The resistive switching cell has a minimum resistance value. When the minimum resistance value is reached, even if current flows from the anode to the cathode of the cell, the resistance of the cell cannot be further reduced. The lowest resistance value is recorded as a fourth-level resistance state, which is recorded as logic 1 when applied to the single-input reversible logic; and is recorded as logic 11 when applied to the dual-input reversible logic.

Between the first-level resistance state and the fourth-level resistance state, operating voltages with different magnitudes may be applied, so that the resistive switching cell reaches a second-level resistance state and a third-level resistance state, which are respectively recorded as 01 state and 10 state. The order of the resistance values of the four resistance states from high to low is a 00 state, a 01 state, a 10 state, and a 11 state. When applied to the dual-input reversible logic, the two-bit logic values represented by the four resistance states are respectively 00, 10, 01, and 11.

When the resistance state of the resistive switching cell is in the 01 state, the 10 state, and the 11 state, a first operating voltage V1 is applied to the bit line where the cell is located, and the word line where the cell is located is grounded, so that the resistance of the cell is varied to the 00 state. When the resistance state of the cell is in the 00 state, a second operating voltage V2 is applied to the word line where the cell is located, and the bit line where the cell is located is grounded, so that the resistance of the cell is varied to the 01 state. When the resistance state of the cell is in the 00 state, a third operating voltage V3 is applied to the word line where the cell is located, and the bit line where the cell is located is grounded, so that the resistance of the cell is varied to the 10 state. When the resistance state of the cell is in the 00 state, a fourth operating voltage V4 is applied to the word line where the cell is located, and the bit line where the cell is located is grounded, so that the resistance of the cell is varied to the 11 state.

Preferably, the four logic operating voltages satisfy in terms of numerical values: V1=V4 and V2+V3=V4.

According to another aspect of the disclosure, a reversible logic operation method is provided. When using a resistive switching cell having four levels of resistance states to implement a reversible logic function, for different logic inputs, the same operation rules is followed. In the operation rule, control signals are introduced. By assigning the control signals with actual logic input values, the different operating voltages are applied.

The control signals include a voltage direction signal C, voltage signals A and B, and a word line voltage selection signal S.

For the voltage signal A, when A=0, 0 voltage, that is, ground is selected; and when A=1, a non-zero voltage V3 or V4 is selected.

For the voltage signal B, when B=0, 0 voltage, that is, ground is selected; and when B=1, a non-zero voltage V3 or V4 is selected.

For the voltage direction signal C, when C=0, the voltage signal A is applied to the bit line where the cell is located, and the voltage signal B is applied to the word line where the cell is located; and when C=1, the voltage signal A is applied to the word line where the cell is located, and the voltage signal B is applied to the bit line where the cell is located;

For the word line voltage selection signal S, when S=0, if a non-zero voltage needs to be applied to the word line, the third operating voltage V3 is selected; and when S=1, if a non-zero voltage needs to be applied to the word line, the fourth operating voltage V4 is selected; and if 0 voltage is applied to the word line, the word line voltage selection signal S will not work.

If a non-zero voltage needs to be applied to the bit line, only the third operating voltage V3 is selected; and if 0 voltage needs to be applied, the bit line is grounded.

The operation rule is: firstly, the voltage direction signal C is determined, and the application positions of the voltage signal A and the voltage signal B are confirmed; secondly, the magnitudes of the voltage signal A and the voltage signal B are determined; then, the word line voltage selection signal S is determined according to the voltage to be applied to the word line; and finally, the operating voltage is applied to complete the logic calculation.

For a single-input NOT reversible logic function, there is only one input signal p. At this time, the voltage signals A and B and the voltage direction signal C in the control signals are used for the logic operation. Let the voltage signal A=0, that is, the voltage signal A is grounded; let the voltage signal B=1, and the fourth operating voltage is selected, that is, the voltage signal B is V4; and let the voltage direction signal C=p.

When the input signal p=1, the voltage direction signal C=1, the voltage signal A is applied to the word line where the cell is located, the voltage signal B is applied to the bit line where the cell is located, and the voltage drop across the resistive switching cell is −V4, so that the resistance of the cell is switched to the first-level resistance state, a 00 state, which is output 0 in the single-input reversible logic function.

When the input signal p=0, the voltage direction signal C=0, the voltage signal A is applied to the bit line where the cell is located, the voltage signal B is applied to the word line where the cell is located, and the voltage drop across the resistive switching cell is V4, so that the resistance of the cell is switched to the fourth-level resistance state, a 11 state, which is output 1 in the single-input reversible logic function.

According to a logic truth table, the single-input NOT reversible logic function is implemented.

For a dual-input C-NOT reversible logic function, there are two input signals p and q. At this time, the voltage signals A and B, the voltage direction signal C, and the word line voltage selection signal S in the control signals are all used for the logic operation. Firstly, the word line where the cell is located is grounded, the fourth operating voltage V4 is applied to the bit line where the cell is located, and the cell is initialized to the first-level resistance state, the 00 state. Secondly, let the voltage signal A=p, the voltage signal B=q, the voltage direction signal C=p, and the word line voltage selection signal S=p to perform the logic operation.

When the input signals p=0 and q=0, the voltage direction signal C=0, the voltage signal A is applied to the bit line where the cell is located, and the voltage signal B is applied to the word line where the cell is located; the voltage signal A=0, the bit line is grounded; and the voltage signal B=0, the word line is grounded; 0 voltage signal is applied to the word line, and the word line voltage selection signal S does not work; the voltage drop across the cell is 0, so that the resistance of the cell is not changed, and the resistance state is still the initial 00 state, which is output 00.

When the input signals p=0 and q=1, the voltage direction signal C=0, the voltage signal A is applied to the bit line where the cell is located, and the voltage signal B is applied to the word line where the cell is located; the voltage signal A=0, the bit line is grounded; and the voltage signal B=1, a non-zero voltage signal is applied to the word line; a non-zero voltage signal should be applied to the word line, and the word line voltage selection signal S=0, the voltage of the word line is confirmed to be the third operating voltage V3; the voltage drop across the cell is V3, so that the resistance of the cell is changed, and the resistance state is switched to the 10 state, which is output 01.

When the input signals p=1 and q=0, the voltage direction signal C=1, the voltage signal A is applied to the word line where the cell is located, and the voltage signal B is applied to the bit line where the cell is located; the voltage signal A=1, a non-zero voltage signal is applied to the word line; the voltage signal B=0, the bit line is grounded; a non-zero voltage signal should be applied to the word line, and the word line voltage selection signal S=1, the voltage of the word line is confirmed to be the fourth operating voltage V4; the voltage drop across the cell is V4, so that the resistance of the cell is changed, and the resistance state is switched to the 11 state, which is output 11.

When the input signals p=1 and q=1, the voltage direction signal C=1, the voltage signal A is applied to the word line where the cell is located, and the voltage signal B is applied to the bit line where the cell is located; the voltage signal A=1, a non-zero voltage signal is applied to the word line; the voltage signal B=1, the third operating voltage V3 is applied to the bit line; a non-zero voltage signal should be applied to the word line, and the word line voltage selection signal S=1, the voltage of the word line is confirmed to be the fourth operating voltage V4; the voltage drop across the cell is V4−V3=V2, so that the resistance of the cell is changed, and the resistance state is switched to the 01 state, which is output 10.

According to the logic truth table, the dual-input C-NOT reversible logic function is implemented.

If a logic output result needs to be read, a read voltage Vread may be applied to the word line of the cell and the bit line of the cell is grounded, the resistance state of the cell may be determined according to the current value, so as to obtain the output result. The read voltage Vread is not enough to vary the resistance state of the cell.

The disclosure implements the single-input and dual-input reversible logic functions in one cell according to the multi-level resistance state characteristic of the resistive switching cell in a crossbar array, which greatly optimizes the circuit structure compared with the traditional reversible logic gate circuit based on the CMOS transistor. One cell is used to store two-bit output information, which improves the information storage capacity. According to the characteristic of one-to-one correspondence between the input and the output in reversible logic, only the logic output result stored in the cell needs to be read to infer the original input information, without any additional process and cell for storing the input information, so as to save the storage space. In the logic calculation process, the calculation result is directly stored in the resistive switching cell in the form of resistance state, which implements the fusion of storage and calculation, so as to improve calculation efficiency and reduce calculation power consumption.

DETAILED DESCRIPTION OF DISCLOSED EMBODIMENTS

In order to make the objectives, technical solution, and advantages of the disclosure clearer, the disclosure will be further described in detail below with reference to the drawings.

Figure 1:
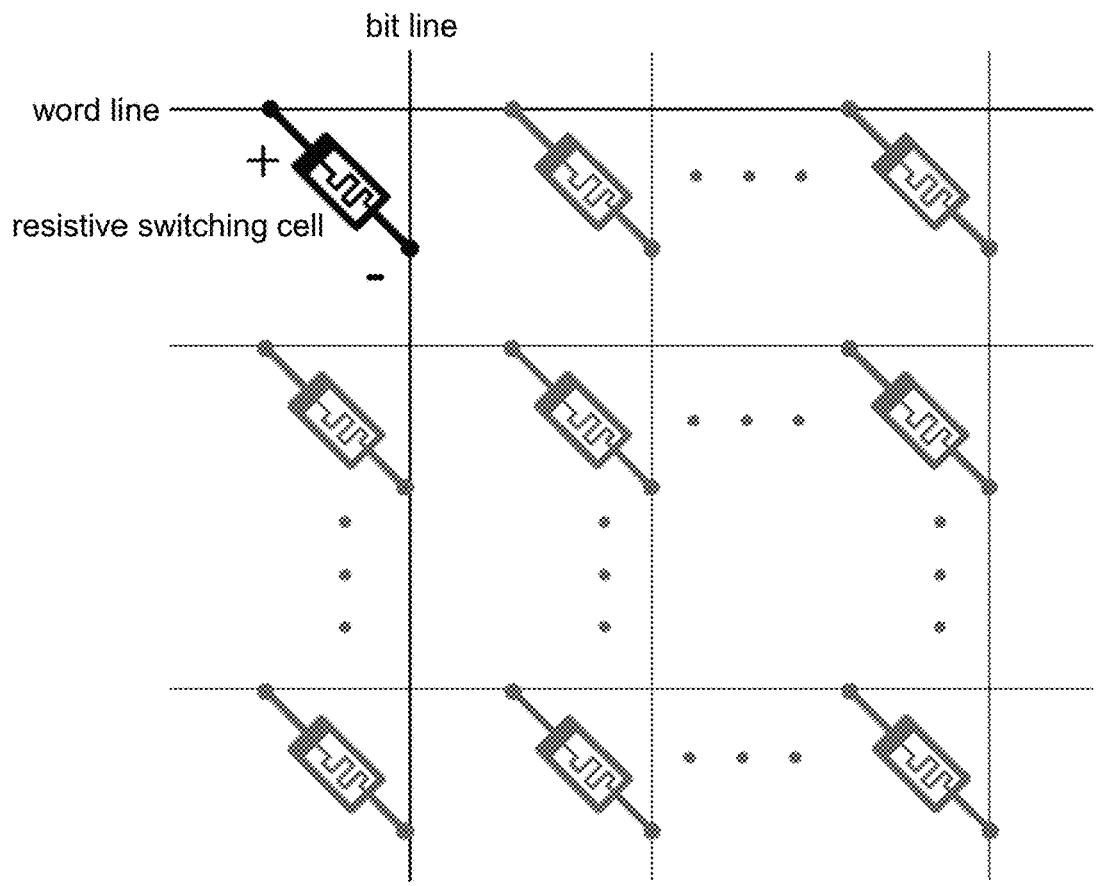
FIG. 1 is a schematic diagram of a structure of a reversible logic circuit according to the disclosure.

FIG. 1 is a schematic diagram of the resistive switching cell crossbar array structure of a reversible logic circuit according to an embodiment of the disclosure. The resistive switching cell crossbar array is composed of word lines and bit lines perpendicular to each other and resistive switching cells. The resistive switching cell is connected between each word line and each bit line. The anode of a resistive switching cell is connected to the word line. The cathode of the resistive switching cell is connected to the bit line. When current flows from the bit line where the resistive switching cell is located to the word line, that is, from the cathode to the anode of the resistive switching cell, the resistance value of the resistive switching cell will become greater. The resistive switching cell has a maximum resistance value. When the maximum resistance value is reached, even if current flows from the cathode to the anode of the cell, the resistance value of the cell cannot be further increased. When current flows from the word line where the resistive switching cell is located to the bit line, that is, from the anode to the cathode of the resistive switching cell, the resistance value of the resistive switching cell will become less. The resistive switching cell has a minimum resistance value. When the minimum resistance value is reached, even if current flows from the anode to the cathode of the cell, the resistance of the cell cannot be further reduced.

Figure 2:
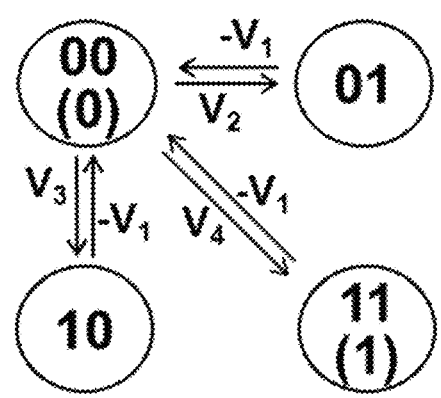
FIG. 2 is a schematic diagram of a conversion relationship between four levels of resistance states of a resistive switching cell according to the disclosure.

FIG. 2 shows four levels of resistance states of a resistive switching cell and a conversion relationship between the resistance states according to the embodiment. The four levels of resistance states are respectively a first-level resistance state 00 state, a second-level resistance state 01 state, a third-level resistance state 10 state, and a fourth-level resistance state 11 state, wherein the 00 state and the 11 state may also be configured to implement a single-input reversible logic function corresponding to high resistance state 0 and low resistance state 1 of binary information.

When the resistance state of the resistive switching cell is in the 01 state, the 10 state, and the 11 state, a first operating voltage V1 is applied to the bit line where the cell is located, and the word line where the cell is located is grounded. At this time, the voltage drop across the cell is −V1, so that the resistance of the cell is varied to the 00 state. When the resistance state of the cell is in the 00 state, a second operating voltage V2 is applied to the word line where the cell is located, and the bit line where the cell is located is grounded. At this time, the voltage drop across the cell is V2, so that the resistance of the cell is varied to the 01 state. When the resistance state of the cell is in the 00 state, a third operating voltage V3 is applied to the word line where the cell is located, and the bit line where the cell is located is grounded. At this time, the voltage drop across the cell is V3, so that the resistance of the cell is varied to the 10 state. When the resistance state of the cell is in the 00 state, a fourth operating voltage V4 is applied to the word line where the cell is located, and the bit line where the cell is located is grounded. At this time, the voltage drop across the cell is V4, so that the resistance of the cell is varied to the 11 state.

The four logic operating voltages satisfy in terms of mathematical relationship: V1=V4 and V2+V3=V4.

Figures 3, 4, 5:
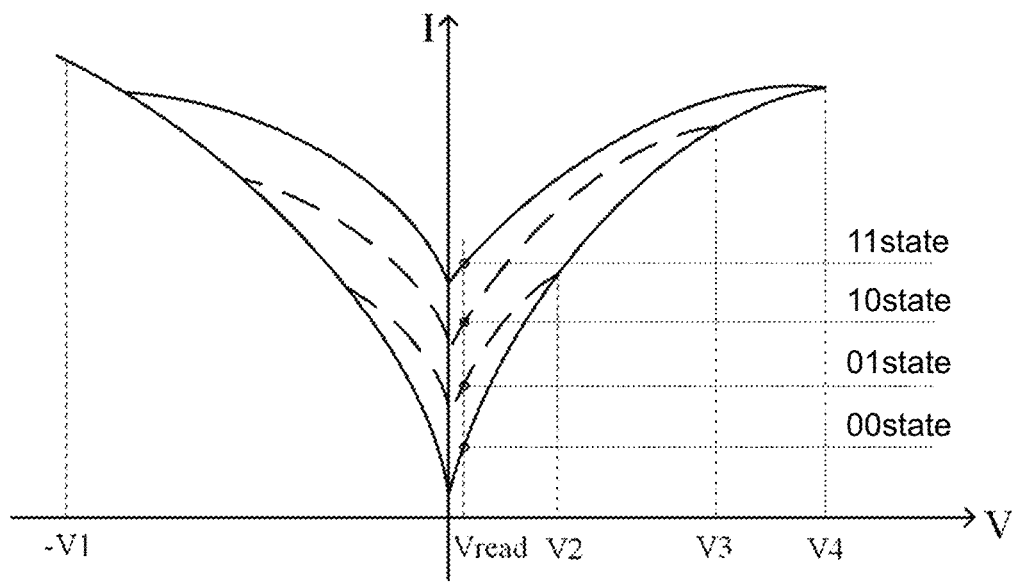
FIG. 3 is an I-V characteristic curve of a resistive switching cell according to the disclosure.
FIG. 4 is a logic truth table of a single-input NOT reversible logic function according to the disclosure.
FIG. 5 is a logic truth table of a dual-input C-NOT reversible logic function according to the disclosure.

FIG. 3 is a schematic diagram of an I-V characteristic curve and a positional relationship of operating voltages of a resistive switching cell according to the embodiment. The resistance value of the resistive switching cell changes as the current flowing through changes. The applied operating voltages V2, V3, and V4 may significantly reduce the resistance value of the cell, and the corresponding operating currents become significantly greater. the applied operating voltage −V1 may increase the resistance value of the cell to the maximum value, and the corresponding operating current is minimum. Compared with V1, V2, V3, and V4, a read voltage Vread is very small and hardly affects the resistance value of the resistive switching cell. The positional relationship of the four levels of resistance states reached by the operating voltages V1, V2, V3, and V4 are also labelled.

FIG. 4 is a logic truth table of a single-input NOT reversible logic operation method according to an embodiment of the disclosure. When a logic input is 0, a logic output is 1; and when the logic input is 1, the logic output is 0. There is a one-to-one correspondence between the input and the output, and input information may be inversely inferred from logic output information.

FIG. 5 is a logic truth table of a dual-input C-NOT reversible logic operation method according to an embodiment of the disclosure. When the logic input is 00, the logic output is 00; when the logic input is 01, the logic output is 01; when the logic input is 10, the logic output is 11; and when the logic input is 11, the logic output is 10. There is a one-to-one correspondence between the input and the output, and the input information may be inversely inferred from the logic output information.

Figure 6:
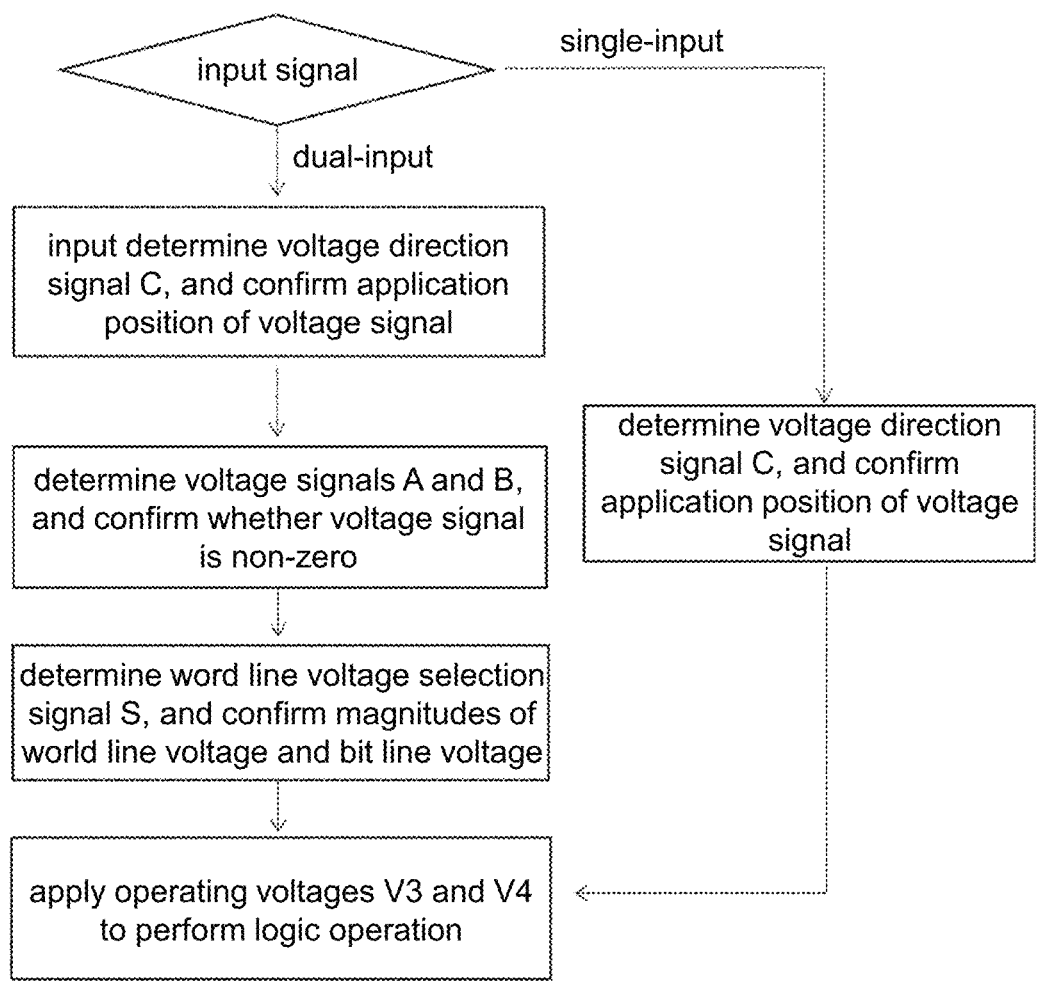
FIG. 6 is a flowchart of a single-input NOT reversible logic operation and a dual-input C-NOT reversible logic operation according to the disclosure.

FIG. 6 is an operation flowchart according to the disclosure. When using the resistive switching cell to implement a reversible logic function, for different logic inputs, the same operation rule is followed. In the operation rule, control signals are introduced. By assigning the control signals with actual logic input values, the different operating voltages are applied.

The control signals include voltage signals A and B, a voltage direction signal C, and a word line voltage selection signal S.

For the voltage signal A, when A=0, 0 voltage, that is, ground is selected; and when A=1, a non-zero voltage V3 or V4 is selected.

For the voltage signal B, when B=0, 0 voltage, that is, ground is selected; and when B=1, a non-zero voltage V3 or V4 is selected.

For the voltage direction signal C, when C=0, the voltage signal A is applied to the bit line where the cell is located, and the voltage signal B is applied to the word line where the cell is located; and when C=1, the voltage signal A is applied to the word line where the cell is located, and the voltage signal B is applied to the bit line where the cell is located;

For the word line voltage selection signal S, when S=0, if a non-zero voltage needs to be applied to the word line, the third operating voltage V3 is selected; and when S=1, if a non-zero voltage needs to be applied to the word line, the fourth operating voltage V4 is selected; and if 0 voltage is applied to the word line, the word line voltage selection signal S will not work.

If a non-zero voltage needs to be applied to the bit line, only the third operating voltage V3 is selected; and if 0 voltage needs to be applied, the bit line is grounded.

The operation rule is: firstly, the voltage direction signal C is determined, and the application positions of the voltage signal A and the voltage signal B are confirmed; secondly, the magnitudes of the voltage signal A and the voltage signal B are determined; then, the word line voltage selection signal S is determined according to the voltage to be applied to the word line; and finally, the operating voltage is applied to complete the logic calculation.

Figure 7:
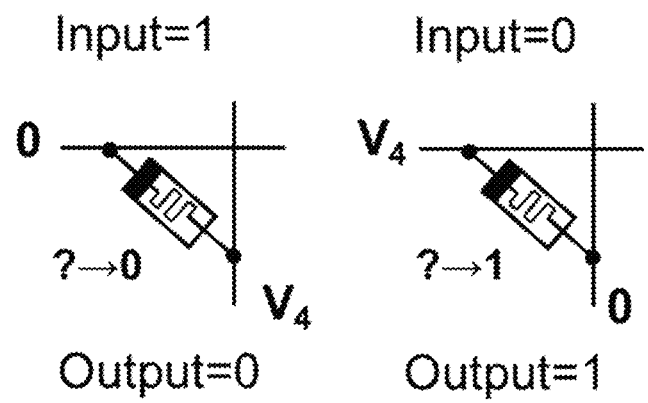
FIG. 7 is a schematic diagram of a single-input NOT reversible logic operation result according to Embodiment 1 of the disclosure.

FIG. 7 is a schematic diagram of a single-input NOT reversible logic operation according to an embodiment of the disclosure. For a single-input NOT reversible logic function, there is only one input signal p. At this time, the voltage signals A and B and the voltage direction signal C in the control signals are used for the logic operation. Let the voltage signal A=0, that is, the voltage signal A is grounded; let the voltage signal B=1, and the fourth operating voltage is selected, that is, the voltage signal B is V4; and let the voltage direction signal C=p.

When the input signal p=1, the voltage direction signal C=1, the voltage signal A is applied to the word line where the cell is located, the voltage signal B is applied to the bit line where the cell is located, and the voltage drop across the resistive switching cell is −V4, so that the resistance of the cell is switched to the first-level resistance state 00 state regardless of the initial resistance state of the cell, which is output 0 in the single-input reversible logic function.

When the input signal p=0, the voltage direction signal C=0, the voltage signal A is applied to the bit line where the cell is located, the voltage signal B is applied to the word line where the cell is located, and the voltage drop across the resistive switching cell is V4, so that the resistance of the cell is switched to the fourth-level resistance state 11 state regardless of the initial resistance state of the cell, which is output 1 in the single-input reversible logic function.

If a logic output result needs to be read, the read voltage Vread may be applied to the word line of the cell and the bit line of the cell is grounded, the resistance state of the cell may be determined according to the current value, so as to obtain the output result. According to the logic truth table, the single-input NOT reversible logic function is implemented.

Figure 8:
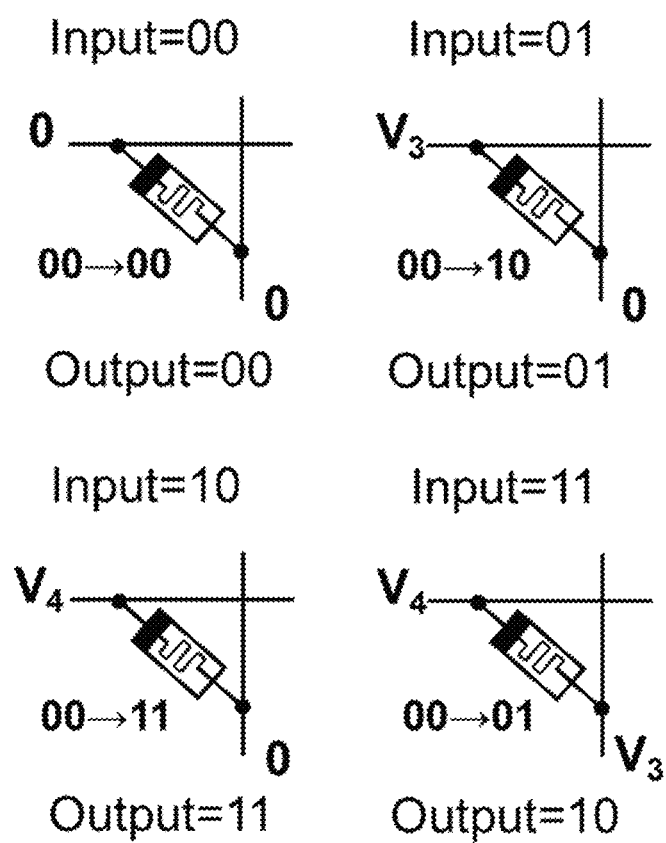
FIG. 8 is a schematic diagram of a dual-input C-NOT reversible logic operation result according to Embodiment 2 of the disclosure.

FIG. 8 is a schematic diagram of a dual-input C-NOT reversible logic operation according to Embodiment 2 of the disclosure. For the dual-input C-NOT reversible logic function, there are two input signals p and q. At this time, the voltage signals A and B, the voltage direction signal C, and the word line voltage selection signal S in the control signals are all used for the logic operation. Firstly, the word line where the cell is located is grounded, the fourth operating voltage V4 is applied to the bit line where the cell is located, and the cell is initialized to the first-level resistance state 00 state. Secondly, let the voltage signal A=p, the voltage signal B=q, the voltage direction signal C=p, and the word line voltage selection signal S=p to perform the logic operation.

When the input signals p=0 and q=0, the voltage direction signal C=0, the voltage signal A is applied to the bit line where the cell is located, and the voltage signal B is applied to the word line where the cell is located; the voltage signal A=0, the bit line is grounded; and the voltage signal B=0, the word line is grounded; 0 voltage signal is applied to the word line, and the word line voltage selection signal S does not work; the voltage drop across the cell is 0, so that the resistance of the cell is not changed, and the resistance state is still the initial 00 state, which is output 00.

When the input signals p=0 and q=1, the voltage direction signal C=0, the voltage signal A is applied to the bit line where the cell is located, and the voltage signal B is applied to the word line where the cell is located; the voltage signal A=0, the bit line is grounded; and the voltage signal B=1, a non-zero voltage signal is applied to the word line; a non-zero voltage signal should be applied to the word line, and the word line voltage selection signal S=0, the voltage of the word line is confirmed to be the third operating voltage V3; the voltage drop across the cell is V3, so that the resistance of the cell is changed, and the resistance state is switched from the initial 00 state to the 10 state, which is output 01.

When the input signals p=1 and q=0, the voltage direction signal C=1, the voltage signal A is applied to the word line where the cell is located, and the voltage signal B is applied to the bit line where the cell is located; the voltage signal A=1, a non-zero voltage signal is applied to the word line; the voltage signal B=0, the bit line is grounded; a non-zero voltage signal should be applied to the word line, and the word line voltage selection signal S=1, the voltage of the word line is confirmed to be the fourth operating voltage V4; the voltage drop across the cell is V4, so that the resistance of the cell is changed, and the resistance state is switched from the initial 00 state to the 11 state, which is output 11.

When the input signals p=1 and q=1, the voltage direction signal C=1, the voltage signal A is applied to the word line where the cell is located, and the voltage signal B is applied to the bit line where the cell is located; the voltage signal A=1, a non-zero voltage signal is applied to the word line; the voltage signal B=1, the third operating voltage V3 is applied to the bit line; a non-zero voltage signal should be applied to the word line, and the word line voltage selection signal S=1, the voltage of the word line is confirmed to be the fourth operating voltage V4; the voltage drop across the cell is V4−V3=V2, so that the resistance of the cell is changed, and the resistance state is switched from the initial 00 state to the 01 state, which is output 10.

If a logic output result needs to be read, the read voltage Vread may be applied to the word line of the cell and the bit line of the cell is grounded, the resistance state of the cell may be determined according to the current value, so as to obtain the output result. According to the logic truth table, the dual-input C-NOT reversible logic function is implemented.

It is easy for persons skilled in the art to understand that the above are only preferred embodiments of the disclosure and are not intended to limit the disclosure. Any modification, equivalent replacement, improvement, etc. made within the spirit and principle of the disclosure should all be included in the protection scope of the disclosure.

The disclosure implements the single-input and dual-input reversible logic functions using only one resistive unit, which requires few devices, has simple operation, and provides an alternative solution for implementation of reversible logic. Also, a logic operation result is directly stored in the resistance state of the resistive unit in a non-volatile manner, which implements the fusion of storage and calculation.

What is claimed is:

1. A reversible logic circuit, comprising: resistive switching cells, word lines, and bit lines, wherein
the word lines and the bit lines are perpendicular to each other;
anodes of the resistive switching cells are connected to the word lines, cathodes of the resistive switching cells are connected to the bit lines, and one of the resistive switching cells are connected between each of the word lines and each of the bit lines; and
the anodes of the resistive switching cells are used as first input terminals to apply logic operating voltages or be grounded, and the cathodes of the resistive switching cells are used as second input terminals to apply the logic operating voltages or be grounded,
wherein each of the resistive switching cells has four levels of resistance states;
a first operating voltage V1 is applied to the second input terminal, the first input terminal is grounded, and the resistive switching cell has a first-level resistance state, which is recorded as a 00 state;
when the resistive switching cell is in the 00 state, a second operating voltage V2 is applied to the first input terminal, the second input terminal is grounded, and the resistive switching cell has a second-level resistance state, which is recorded as a 01 state;
when the resistive switching cell is in the 00 state, a third operating voltage V3 is applied to the first input terminal, the second input terminal is grounded, and the resistive switching cell has a third-level resistance state, which is recorded as a 10 state; and
when the resistive switching cell is in the 00 state, a fourth operating voltage V4 is applied to the first input terminal, the second input terminal is grounded, and the resistive switching cells has a fourth-level resistance state, which is recorded as a 11 state.

2. The reversible logic circuit according to claim 1, wherein during operation, the different logic operating voltages are applied to vary the resistances of the resistive switching cells:
when currents flow from the word lines where the resistive switching cells are located to the bit lines where the resistive switching cells are located, resistance values of the resistive switching cells are reduced; and
when currents flow from the bit lines where the resistive switching cells are located to the word lines where the resistive switching cells are located, the resistance values of the resistive switching cells are increased.

3. The reversible logic circuit according to claim 1, wherein each of the logic operating voltages satisfies in terms of numerical values V1=V4 and V2+V3=V4.

4. An operation method for information reading function based on the reversible logic circuit according to claim 1, comprising following steps:
applying the fourth operating voltage V4 through a voltage direction signal C; wherein if C=0, the fourth operating voltage V4 is applied to the first input terminal, and the second input terminal is grounded; and if C=1, the fourth operating voltage V4 is applied to the second input terminal, and the first input terminal is grounded; and
applying a voltage Vread to the first input terminal, wherein the second input terminal is grounded, and a magnitude of current in the circuit is detected for reading data in the resistive switching cells; wherein
a voltage amplitude of the voltage Vread is no greater than 50 mV.

5. The operation method according to claim 4, wherein when a current value detected is small or large, the resistive switching cells are respectively in the 00 state and the 11 state, and corresponding reading results are respectively 0 and 1.

6. An operation method for information reading function based on the reversible logic circuit according to claim 1, comprising following steps:
applying the first operating voltage V1 to the second input terminal, wherein the first input terminal is grounded, and the resistive switching cells are in the 00 state;
applying an operating voltage signal through a voltage direction signal C; wherein if C=0, an operating voltage signal B is applied to the first input terminal, and an operating voltage signal A is applied to the second input terminal; and if C=1, the operating voltage signal A is applied to the first input terminal, and the operating voltage signal B is applied to the second input terminal;
if A=1, non-zero voltage is selected according to a voltage selection signal S; and if A=0, ground;
if B=1, non-zero voltage is selected according to the voltage selection signal S; and if B=0, ground;
if S=1, the fourth operating voltage V4 is applied; and if S=0, the third operating voltage V3 is applied; and
a voltage Vread is applied to the first input terminal, the second input terminal is grounded, and a magnitude of current in the circuit is detected for reading data in the resistive switching cells; wherein
a voltage amplitude of the voltage Vread is no greater than 50 mV.

7. The operation method according to claim 6, wherein when a current value detected is from small to large, the resistive switching cells are respectively in the 00 state, the 01 state, the 10 state, and the 11 state, and corresponding reading results are respectively 00, 01, 10, and 11.

8. An operation method for a single-input NOT reversible logic function based on the reversible logic circuit according to claim 1, comprising following steps:

giving a logic input value p to a voltage direction signal C; wherein if the logic input p=0, C=0, the fourth operating voltage V4 is applied to the first input terminal, the bit lines where the resistive switching cells are located are grounded, the resistances of the resistive switching cells are switched to the 11 state, and an output is recorded as logic "1"; and if the logic input p=1, C=1, the fourth operating voltage V4 is applied to the second input terminal, the word lines where the resistive switching cells are located are grounded, the resistances of the resistive switching cells are switched to the 00 state, and the output is recorded as logic "0".

9. An operation method for a dual-input C-NOT reversible logic function based on the reversible logic circuit according to claim 1, comprising following steps:

giving logic input values to a voltage direction signal C, an operating voltage signal A, an operating voltage signal B, and a voltage selection signal S, that is, C=p, A=p, B=q, and S=p; wherein if the logic inputs p=0 and q=0, at this time A=0, B=0, C=0, and S=0, both the first input terminal and the second input terminal are grounded, the resistances of the resistive switching cells are switched to the 00 state, and an output is recorded as logic "00";

if the logic inputs p=0 and q=1, at this time A=0, B=1, C=0, and S=0, the third operating voltage V3 is applied to the first input terminal, the second input terminal is grounded, the resistances of the resistive switching cells are switched to the 10 state, and the output is recorded as logic "01";

if the logic inputs p=1 and q=0, at this time A=1, B=0, C=1, and S=1, the fourth operating voltage V4 is applied to the first input terminal, the second input terminal is grounded, the resistances of the resistive switching cells are switched to the 11 state, and the output is recorded as logic "11"; and if the logic inputs p=1 and q=1, at this time A=1, B=1, C=1, and S=1, the fourth operating voltage V4 is applied to the first input terminal, the third operating voltage V3 is applied to the second input terminal, the resistances of the resistive switching cells are switched to the 01 state, and the output is recorded as logic "10".

* * * * *